US010847944B2

(12) United States Patent
Larsson et al.

(10) Patent No.: US 10,847,944 B2
(45) Date of Patent: Nov. 24, 2020

(54) METHOD FOR MONITORING A CRIMPING PROCESS

(71) Applicant: Elpress AB, Kramfors (SE)

(72) Inventors: Peter Larsson, Kramfors (SE); Johannes Bålhammar, Kramfors (SE)

(73) Assignee: ELPRESS AB, Kramfors (SE)

( * ) Notice: Subject to any disclaimer, the term of this patent is extended or adjusted under 35 U.S.C. 154(b) by 257 days.

(21) Appl. No.: 15/979,746

(22) Filed: May 15, 2018

(65) Prior Publication Data

US 2018/0337504 A1 Nov. 22, 2018

(30) Foreign Application Priority Data

May 16, 2017 (SE) ....................................... 1750607

(51) Int. Cl.
*G01R 31/28* (2006.01)
*H01R 43/048* (2006.01)
*H01R 43/042* (2006.01)

(52) U.S. Cl.
CPC ....... *H01R 43/0486* (2013.01); *H01R 43/042* (2013.01); *H01R 43/0421* (2013.01); *H01R 43/0427* (2013.01)

(58) Field of Classification Search
CPC ...... G01N 29/04; G01N 29/07; G01N 29/221; G01N 29/265; H01R 43/048; H01R 43/0486; H01R 43/0488; H01R 43/058; H01R 43/0207
See application file for complete search history.

(56) References Cited

U.S. PATENT DOCUMENTS 4,561,282 A * 12/1985 Hadden, Sr. ............ B25B 7/123 29/751
4,934,204 A * 6/1990 Hadden, Sr. .............. B25B 7/12 269/196
5,113,679 A 5/1992 Ferraro et al.
(Continued)

FOREIGN PATENT DOCUMENTS

WO 2016005838 A1 1/2016
WO 2016198973 A1 12/2016

OTHER PUBLICATIONS

Swedish Search Report to corresponding Swedish application 1750607-2, dated Dec. 4, 2017, 2 pages.
(Continued)

*Primary Examiner* — Paul D Kim
(74) *Attorney, Agent, or Firm* — Cooper Legal Group, LLC; Ronald M. Kachmarik

(57) ABSTRACT

Method for monitoring a crimping process including arranging an end fitting or coupling in an intended position between a first and second crimping jaw and initiating the crimping process, continuously detecting the position of the first and second jaw in relation to the other and the applied pressure and store the detected information in a control unit; comparing the detected information regarding position and applied pressure against predetermined characteristics determined for a crimping process with the desired quality; and if the detected information differs from the predetermined characteristics determined for a crimping process with the desired quality more than a predetermined value send alert to indicate that the crimping process not has the desired quality.

6 Claims, 2 Drawing Sheets

(56) References Cited

U.S. PATENT DOCUMENTS

| | | | | |
|---|---|---|---|---|
| 6,510,719 | B2 * | 1/2003 | Goop | B21D 39/04 29/720 |
| 7,036,806 | B2 * | 5/2006 | Amherd | B21D 39/048 269/3 |
| 7,421,871 | B2 * | 9/2008 | Goop | B21D 39/04 29/720 |
| 10,312,653 | B2 * | 6/2019 | Ballard | H01R 43/0427 |
| 2002/0148274 | A1 | 10/2002 | Goop | |
| 2007/0104445 | A1 * | 5/2007 | Larson | G02B 6/3846 385/134 |
| 2011/0247506 | A1 * | 10/2011 | Frenken | B30B 15/166 100/43 |

OTHER PUBLICATIONS

Swedish Office action to corresponding Swedish application 1750607-2, dated Dec. 4, 2017, 5 pages.

* cited by examiner

METHOD FOR MONITORING A CRIMPING PROCESS

FIELD OF THE INVENTION

The present invention relates to a method for monitoring a crimping process where an end fitting or coupling is secured to a conductor or wire by a crimping tool.

BACKGROUND OF THE INVENTION

Within many different technical fields such as power stations, wind mills or facilities where larger quantities of electrical power are consumed or transferred there is a need for reliable connections between electrical conductor, for example cables or wires, and thereto related equipment. These connections are made by end couplings or end fittings press fitted, i.e. crimped, to the end of the cable or wire by an electric or hydraulic pressing or crimping tool The end of the wire or cable is fitted within a recess in the end fitting or coupling before the end fitting or coupling is arranged within the clamping pincer of the tool. As soon as the end fitting or coupling is in the correct position one, or more, moving part of the pincer are moved towards the end fitting or end coupling and a predetermined pressure is applied to deform the end fitting or coupling to permanently clamp the end fitting or coupling to the wire or cable.

In order to ensure the desired permanent clamping of the end fitting or coupling to the conductor as well as the best possible mechanical and electrical connection between the end fitting or coupling and the conductor, the size and dimension of the conductor and the end fitting or coupling must correspond to each other. Furthermore, the clamping pincer must have the right size, and the correct pressure applied during the crimping or pressing in order to deform the end fitting or coupling as intended.

There are different types of pressing or crimping tools available on the market today that all are intended to provide the crimping or press fitting of end fittings or couplings to a conductor such as a cable or wire, and for example in U.S. Pat. No. 6,662,621 one pressing tool apparatus, and a control method are disclosed. The tool apparatus comprises sensors that are configured to verify that the clamping pincer is moved the correct distance to ensure the desired deformation of the end fitting or coupling when a predetermined pressure is applied.

However, there are still a need for further improved method for monitoring a crimping process to ensure an even higher accuracy in the crimping or pressing process to ensure the desired mechanical and electrical properties.

SUMMARY OF THE INVENTION

The present invention, defined in the appended claims, provides a method for monitoring a crimping process where an end fitting or coupling is secured to a conductor or wire by a crimping tool, that to at least some extent fulfils the needs defined above.

The invention relates to a method for monitoring a crimping process where an end fitting or coupling is secured to a conductor by a crimping tool comprising:

- a pincer comprising at least a first and a second crimping jaw, at least one of said first and second crimping jaw is movably arranged in relation to the other;
- means for moving the at least one movably arranged crimping jaw between a first and a second position, said first position is an open position that makes it possible to arrange the end fitting or coupling in the intended position between the jaws or remove the end fitting or coupling from the jaws and the second position is a position that ensures that the end fitting or coupling has been compressed and secured to the conductor or wire;
- a position sensor continuously detecting the position of the first and second jaw in relation to the other during movement from the first position to the second position;
- a pressure sensor arranged to continuously detect the pressure applied on the end fitting or coupling, and
- a control unit arranged to control the operation of the tool, and collect and store the information detected by the position sensor regarding the position of the at least first and second jaw during the crimping process and information regarding the applied pressure on the end fitting or coupling by the pincer during the crimping process, wherein said method comprises the steps:

a) arrange the end fitting or coupling in the intended position between the first (18) and second crimping jaw (19) and initiate the crimping process;

b) continuously detecting the position of the first and second jaw in relation to the other and the applied pressure and store the detected information in the control unit;

c) compare the detected information regarding position and applied pressure against predetermined characteristics determined for a crimping process with the desired quality;

d) if the detected information differs from the predetermined characteristics determined for a crimping process with the desired quality more than a predetermined value send alert to indicate that the crimping process not has the desired quality.

The claimed method for monitoring a crimping process fulfils the needs defined above since the method provides an excellent possibility to verify the conducted crimping to a predetermined crimping process conducted as required to provide the desired reliable securing and contact between the end fitting or coupling and the conductor.

The possibility to continuous monitor the movement of the crimping jaw, or jaws, and the applied pressure on the end fitting or coupling makes it possible to verify that the crimping process has been conducted as required to provide the desired reliable securing and contact to ensure the best mechanical and electrical properties between the end fitting or coupling and the conductor.

The detected information regarding applied pressure and movement of the crimping jaws during the crimping process is compared to a predetermined optimal crimping process for the particular combination of end fitting or coupling and conductor that is stored in the control unit in order to make it possible to identify if something during the conducted crimping differs from the predetermined optimal crimping process.

One embodiment of the method according to the invention further comprises the step of starting the crimping process by first determining the type of end fitting, or coupling, based on the information from the position sensor and pressure sensor and then adapt the crimping process to the determined size of end fitting or coupling. This embodiment further improves the accuracy in the monitoring since the conducted crimping will be compared to the predetermined characteristic for that particular type of end fitting or coupling. A further advantage with this embodiment is that the continuous monitoring of the movement of the crimping jaw, or jaws, and the applied pressure makes it possible to determine the type of end fitting that is arranged between the jaws and adapt the crimping process, i.e. the applied pressure and pressing length, to the actual type of end fitting which ensures that a correct fitting is achieved. This opportunity to adapt the crimping process also has the advantage that not more than necessary electrical powered is consumed which extend the intervals between required charging of the battery.

One embodiment of the method, comprises the step of adapting the crimping process based on the determined type and size of end fitting, or coupling to reduce energy consumption and wear on the at least first and second crimping jaw. The fact that each crimping process is ended when the crimp of the particular coupling or end fitting is completed reduces the wear on the jaws considerably since conventional tools applies the same high pressure on the jaws no matter the size and type of coupling or end fitting.

One embodiment of the method according to the invention further comprises the step of transferring the determined information to an external remote monitoring unit. This embodiment is favourable since the remote monitoring unit could be arranged to collect information from several different tools and conduct the desired verification of the conducted crimping for several tools simultaneously. This embodiment reduces the number of components required in the tool which reduces the overall size of the tool.

One embodiment of the method according to the invention further comprises the step of storing the determined information for future inspections of the conducted crimping process. This embodiment makes it possible to regularly inspect installations of end fittings or couplings where the conducted crimpings may be of less good quality.

One embodiment of the method according to the invention further comprises the step of storing the determined information together with information about the geographical position of the conducted crimping process to facilitate future inspections of conducted crimpings that may be of less good quality and therefore have an increased risk for failure.

In one embodiment of the method according to the invention, the continuous monitoring of the crimping process involves that the information regarding position of the first and second jaw in relation to the other and the applied pressure is determined continuously during the crimping process.

In one embodiment of the method according to the invention, the continuous monitoring of the crimping process involves that the information regarding position of the first and second jaw in relation to the other and the applied pressure is determined at least 100 times/second. This number of measurements ensures the desired accuracy to monitor the entire crimping process.

In one embodiment of the method according to the invention, the continuous monitoring of the crimping process involves that the information regarding position of the first and second jaw in relation to the other and the applied pressure is determined at least 1000 times/second. This number of measurements is intended for use in combination with specific combinations of end fittings and conductors where the demands on the crimp is extremely high.

Different embodiments of the tool and the method described above could of course be combined and modified in different ways without departing from the scope of the invention that will be described more in detail in the detailed description.

BRIEF DESCRIPTION OF THE DRAWINGS

Different embodiments of a crimping tool according to the present invention are schematically illustrated in the appended figures.

DETAILED DESCRIPTION

Figure 1:
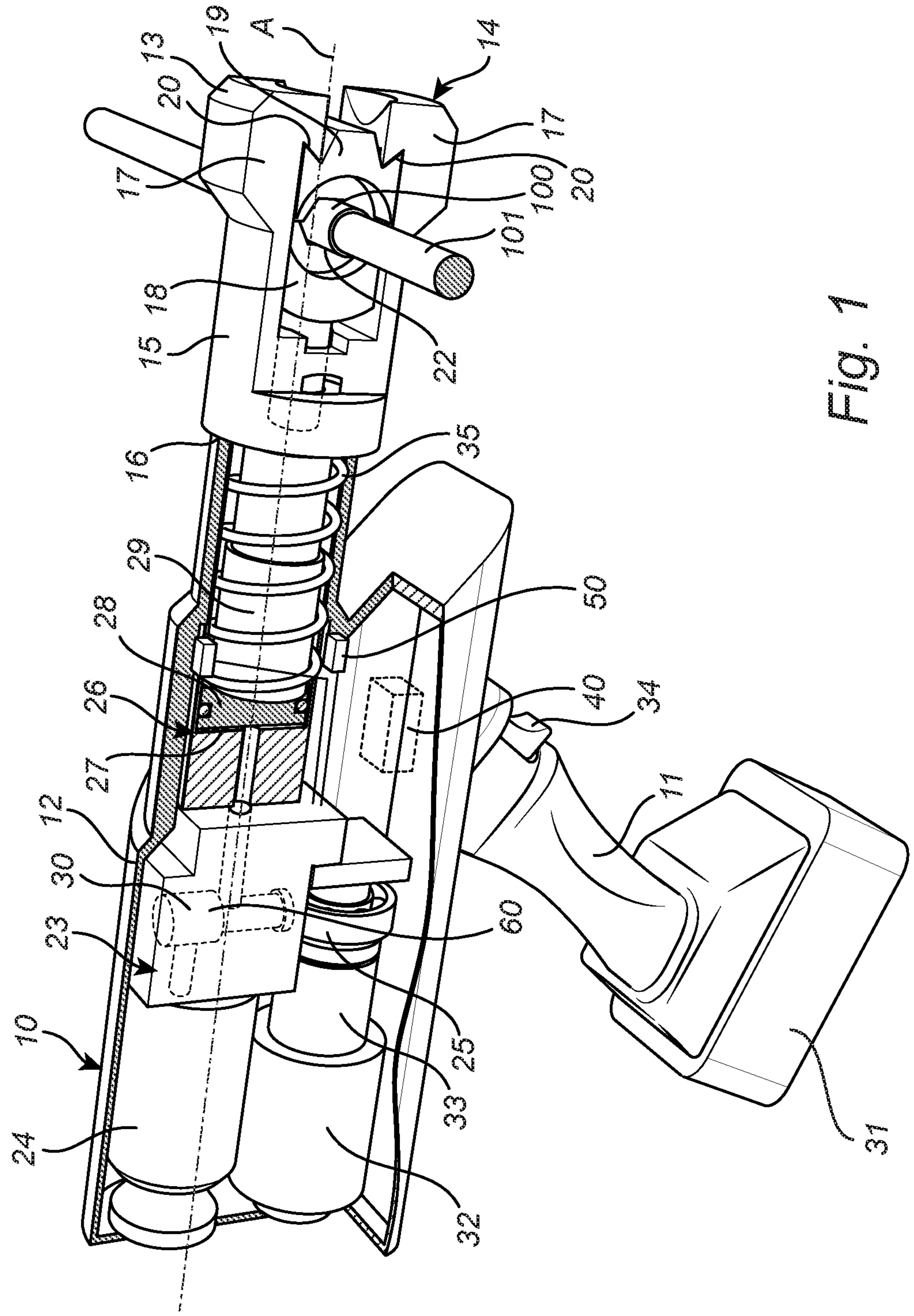
FIG. 1 illustrates a perspective view of a crimping tool. The tool housing is partly removed to illustrate the different components within the tool.

In FIG. 1, a perspective view of one embodiment of a hand held crimping tool 10 is illustrated. The crimping tool 10 could however also be embodied as a stationary tool adapted for crimping a wider range of end fitting sizes.

The illustrated crimping tool 10 is intended to be hand-held and has a "gun-shape" with a handle 11 and a tool body 12 extending along a longitudinal axis A. The crimping tool 10 comprises a number of different components arranged within the tool body to make the crimping tool work as intended and perform the desired crimping of an end fitting 100, or coupling, to a conductor 101, i.e. wire or cable, illustrated schematically in FIG. 1.

In the forward end 13 of the tool a pincer 14 is arranged. The pincer comprises a support element 15 with an aft end 16 stationary secured in the tool body 12. The aft end is sleeve shaped and arranged substantially coaxially to the longitudinal axis A of the tool. From the aft end 16, two rigid members 17 extend substantially parallel to axis A in the forward direction. The two members are arranged such that a space is formed between the two members for a first 18 and a second 19 crimping jaw.

The forward end of the members 17 are designed such that a backwards facing shoulder 20 is formed on each member in the space between the two members. The shoulders 20 form support surfaces for the forward crimping jaw, i.e. in the illustrated embodiment the second crimping jaw, such that the second crimping jaw is maintained in the intended position between the two members in the forward end of the pincer.

Aft of the second crimping jaw 19, the first crimping jaw 18 is movably arranged between the two members of the pincer. The first jaw is movable along axis A within the pincer such that the desired crimping of an end fitting arranged between the first and second crimping jaw is achieved. In the side of the first and second crimping jaw facing each other a cut out portion 22 with a size and shape corresponding to the size and shape of selected end fitting is formed. The first and second crimping jaw are preferably removably arranged between the members of the pincer in order to make it possible to adapt the crimping tool to end fittings of different sizes by selection of the right crimping jaws.

The first crimping jaw is movable between a first retracted end position and a second position in which the crimping process is ended and the end fitting deformed to be permanently secured to the conductor. The retracted first position is an open position that makes it possible to arrange the end fitting or coupling in the intended position between the first and second jaw, alternatively remove the end fitting or coupling from the jaws when the crimping process is completed, and the second position is a position that ensures that the end fitting or coupling has been compressed and permanently secured to the conductor or wire. The pincer could be modified in different ways and there are different configurations available on the market today.

The crimping tool furthermore comprises means 23 for moving the first crimping jaw and make it possible to apply the required pressure on the end fitting to achieve the permanent securing of the end fitting to the conductor, i.e. the cable or wire. In the illustrated embodiment of the tool the movement of the first crimping jaw is hydraulically powered and the crimping tool consequently comprises the required components to power the tool.

The hydraulic system of the crimping tool is of conventional type used for this type of products and comprises a tank 24 for storing a hydraulic fluid. The storage tank is in fluid connection with a pump 25 that is arranged to generate a flow of pressurized hydraulic fluid from the tank to a hydraulic cylinder 26 extending along the longitudinal direction A of the tool and arranged to move the first crimping jaw from the first extracted position towards the second position.

The hydraulic cylinder 26 comprises an aft end wall 27 and a plunger 28 movably arranged within the cylinder. From the plunger a piston 29 extend in forward direction and exits the cylinder via a corresponding opening in a forward end wall, not illustrated in FIG. 1, of the hydraulic cylinder and continues via an opening in the support element to the first crimping jaw.

The pressurized hydraulic fluid enters the space within the cylinder between the aft end wall and the movable plunger such that the plunger, and piston connected to the first crimping jaw, are moved forward when the space within the cylinder is filled with pressurized hydraulic fluid forcing the plunger to move in the forward direction. The amount of the pressurized hydraulic fluid fed to the cylinder is either controlled by the speed of the pump or a valve 30 arranged downstream the pump.

After the crimping process is ended, i.e. the first crimping jaw has reached the desired forward end position, the pressure within the cylinder is released by a second valve arranged to control the outlet for hydraulic fluid exiting the cylinder and returning to the tank. A rechargeable battery 31 is arranged within the handle to power an electrical motor 32 arranged in the aft region of the tool body. The electrical motor is via a gear 33, or gear box, arranged to drive the pump for the hydraulic fluid to pressurize the hydraulic fluid circulating within the hydraulic system of the crimping tool. The crimping process is started by a lever 34 arranged in the handle 11.

The illustrated embodiment of the tool involves a hydraulic cylinder that is only able to exert a movement in one direction, i.e. the forward direction of the tool, and a helical spring 35 arranged around the piston is arranged to return the plunger and piston to the initial first position when the second valve is opened and the pressure within the hydraulic cylinder is released. The force exerted by the spring furthermore returns the hydraulic fluid within the cylinder to the storage tank.

All the different components of the crimping tool are controlled by a control unit 40 arranged within the tool body. The control unit monitors and controls the operation of the crimping tool. The crimping tool may also comprise a user interface for delivering information from the tool to the use and make it possible for the user to adjust or select different operational parameters of the crimping tool such as for example the intended size and type of the end fittings or couplings.

The crimping tool furthermore comprises a position sensor 50 arranged within the tool body to detect the position of the piston, and the first crimping jaw, along the longitudinal axis A. The position sensor is preferably arranged within the tool body and comprises one stationary arranged detecting part and a corresponding part arranged along the piston such that the movement between the stationary part and the piston is detectable by the sensor.

Furthermore, the crimping tool comprises a pressure sensor 60 arranged to detect the pressure applied on the end fitting or coupling. Different types of pressure sensors could be used and the pressure sensor is only schematically illustrated in the figures. One favourable embodiment involves a pressure sensor arranged to detect the pressure within the pressurized hydraulic fluid to determine the pressure applied by the cylinder on the first crimping jaw and consequently the end fitting during the crimping process.

In the crimping tool, the control unit is arranged to control the operation of the tool during the crimping process and continuously collect and store the information detected by the position sensor regarding the position of the first and second jaw in relation to each other and the information regarding the applied pressure on the end fitting or coupling.

During operation, the conducted crimp is monitored to verify if the desired high quality crimp is achieved, or if something during the conducted crimping process went wrong and need further attendance.

The method according to the invention comprises the steps:

1) arrange the end fitting or coupling in the intended position between a first and second crimping jaw and initiate the crimping process;
2) continuously detecting the position of the first and second jaw in relation to the other and the applied pressure and store the detected information in the control unit,
3) compare the detected information regarding position and applied pressure against predetermined characteristics determined for a crimping process with the desired quality.
4) if the detected information differs from the predetermined characteristics determined for a crimping process with the desired quality more than a predetermined value send alert to indicate that the crimping process not has the desired quality.

The detected information regarding applied pressure and movement of the crimping jaws during the crimping process is compared to a predetermined optimal crimping process for the particular combination of end fitting or coupling and conductor that is stored in the control unit in order to make it possible to identify if something during the conducted crimping differed from the predetermined optimal crimping process.

The control unit could also be arranged to start the crimping process by first determining the type of end fitting, or coupling, based on the information from the position sensor and pressure sensor and then adapt the crimping process to the determined size of end fitting or coupling. The size, i.e. type of end fitting or coupling is detected by identifying the actual position of the first and second crimping jaw during movement from the first position towards the second position in which the applied pressure increases significantly.

The monitoring of the conducted crimping process could also be conducted in an external remote monitoring unit where the information is stored for future inspections of the conducted crimping process.

Figure 2:
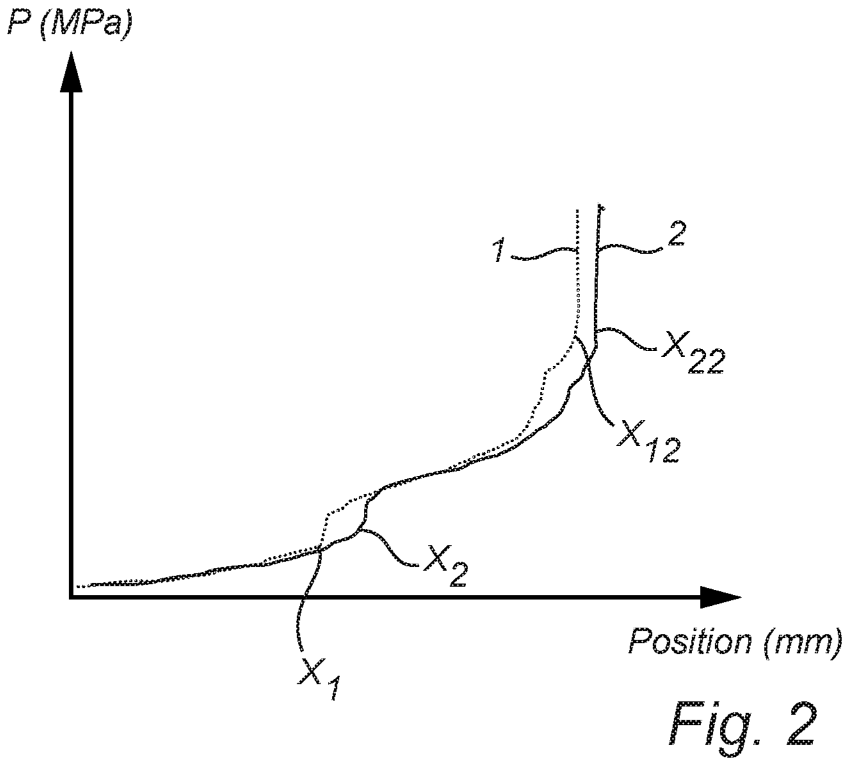
FIG. 2 illustrates a diagram in which examples of the determined values regarding position and applied pressure during the crimping process are presented.

In FIG. 2, a diagram illustrating the determined result from one conducted crimping (graph 2) and one predetermined optimal crimping (graph 1) for a particular combination of end fitting or coupling and conductor such a wire or cable. The position of the first crimping jaw is illustrated along the x-axis and the applied pressure on the y-axis. The position x1 along graph 1 and x2 along graph 2 indicates the type/size of the end fitting or coupling. The position x12 along graph 1 and x22 along graph 2 indicates the position where the crimping jaws have reached the end position and no further movement of the jaws in relation to each other is possible no matter the applied pressure, and consequently the graph between the x1 and x12 and x2 and x22 illustrates the part of the crimping process were the end fitting or coupling is deformed to achieve the permanent securing to the cable or wire.

In the illustrated example, there is a difference between the predetermined optimal values for the actual combination of end fitting or coupling and conductor and the determined values. If the difference is larger than a predetermined acceptable difference this indicates that the conducted crimping does not have the desired quality.

The different embodiments described above could all be combined and modified in different ways without departing from the scope of the invention that is defined by the appended claims.

The invention claimed is:

1. Method for monitoring a crimping process where an end fitting or coupling is secured to a conductor by a crimping tool comprising:

a pincer comprising at least a first and a second crimping jaws, at least one of said first and second crimping jaws is movably arranged in relation to the other;

means for moving the at least one movably arranged crimping jaw between a first and a second position, said first position is an open position that makes possible to arrange the end fitting or coupling in the intended position between the jaws or remove the end fitting or coupling from the jaws and the second position is a position that ensures that the end fitting or coupling has been compressed and secured to a conductor or wire;

a position sensor continuously detecting the position of the first and second jaws in relation to each other during movement from the first position to the second position;

a pressure sensor arranged to continuously detect a pressure applied on the end fitting or coupling, and a control unit arranged to control the operation of the tool during the crimping process, and collect and store the information detected by the position sensor regarding the position of the at least first and second jaws during the crimping process and information regarding the applied pressure on the end fitting or coupling by the pincer during the crimping process, wherein said method comprises the steps:

a) arranging the end fitting or coupling in the intended position between the first and second crimping jaw and initiate the crimping process;

b) starting the crimping process by first determining the type of end fitting, or coupling, based on the information from the position sensor and pressure sensor;

c) continuously detecting the position of the first and second jaws in relation to the other and the applied pressure and store the detected information in the control unit;

d) comparing the detected information regarding position and applied pressure against predetermined characteristics determined for a crimping process with the selected parameter; and e) if the detected information differs from the predetermined characteristics determined for the crimping process with the selected parameter more than a predetermined value, sending alert to indicate that the crimping process does not have the selected parameter;

wherein the method is characterized by the continuous monitoring of the crimping process involves that the information regarding position of the first and second crimping jaws in relation to the other and the applied pressure is determined at least 100 times/second, and;

that the method further comprises the step of:

adapting the crimping process to a determined type and size of end fitting, or coupling to reduce energy consumption and wear on the at least first and second crimping jaw.

2. Method according to claim 1, further comprising a step of transferring a determined information to an external remote monitoring unit.

3. Method according to claim 1, further comprising a step of storing a determined information for future inspections of the conducted crimping process.

4. Method according to claim 1, further comprising the step of storing a determined information together with information about a geographical position of the conducted crimping process.

5. Method according to claim 1, wherein the continuous monitoring of the crimping process involves that the information regarding position of the first and second jaws in relation to each other and the applied pressure is determined continuously during the crimping process.

6. Method according to claim 1, wherein the continuous monitoring of the crimping process involves that the information regarding position of the first and second jaws in relation to each other and the applied pressure is determined at least 1000 times/second.

* * * * *